United States Patent [19]
Sugawara et al.

[11] Patent Number: 5,994,736
[45] Date of Patent: Nov. 30, 1999

[54] SEMICONDUCTOR DEVICE HAVING BURIED GATE ELECTRODE WITH SILICIDE LAYER AND MANUFACTURE METHOD THEREOF

[75] Inventors: Masahiro Sugawara; Katsuki Hazama, both of Tokyo, Japan

[73] Assignee: United Microelectronics Corporation, Los Altos, Calif.

[21] Appl. No.: 09/134,378

[22] Filed: Aug. 14, 1998

[30] Foreign Application Priority Data

Sep. 22, 1997 [JP] Japan ................................ 9-275043

[51] Int. Cl.$^6$ ........................ H01L 29/76; H01L 29/94; H01L 31/062; H01L 31/113; H01L 31/119
[52] U.S. Cl. ........................ 257/330; 257/333; 257/384
[58] Field of Search ................................ 257/330, 332, 257/333, 334, 382, 383, 384

[56] References Cited

U.S. PATENT DOCUMENTS

| | | |
|---|---|---|
| 4,885,617 | 12/1989 | Mazure-Espejo et al. . |
| 4,952,993 | 8/1990 | Okumura . |
| 5,444,282 | 8/1995 | Yamaguchi et al. ............... 257/344 |
| 5,448,094 | 9/1995 | Hsu ........................................ 257/330 |

FOREIGN PATENT DOCUMENTS

| | | |
|---|---|---|
| 2-46775 | of 1990 | Japan . |
| 3-30104 | of 1995 | Japan . |
| 8-32063 | of 1996 | Japan . |

*Primary Examiner*—Ngân V. Ngô
*Attorney, Agent, or Firm*—Pollock, Vande Sande & Amernick

[57] ABSTRACT

A semiconductor device in which a salicide structure is applied to a buried gate transistor to largely reduce a difference of level or height in a element and to reduce the resistance of a gate electrode and a source/drain structure, thus enabling reliable high speed operations while maintaining high performance. For manufacturing the semiconductor device, a silicon substrate is formed with a groove for a buried gate. A gate insulating film is formed on the bottom surface of the groove. Then, side-wall insulating films are formed on both side surfaces of the groove in a large thickness as compared with that of the gate insulating film. Next, after a gate electrode is formed from a polycrystalline silicon film, a source/drain structure is formed in the silicon substrate through the gate electrode and the side-wall insulating film. Then, a Ti film is formed and annealed to form silicide layers on the gate electrode and on the source/drain electrodes, thus completing a salicide structure.

6 Claims, 7 Drawing Sheets

SEMICONDUCTOR DEVICE HAVING BURIED GATE ELECTRODE WITH SILICIDE LAYER AND MANUFACTURE METHOD THEREOF

BACKGROUND OF THE INVENTION

1. Field of the Invention

The present invention relates to a semiconductor device including an element, for example, a MOS transistor which has a so-called buried gate electrode, and to a manufacturing method thereof.

2. Description of the Related Art

With recent development in miniaturization and integration of semiconductor devices, techniques for reducing the resistance of electrodes and a variety of wires have been considered for increasingly miniaturized and highly integrated semiconductor devices. One of promising techniques is a so-called salicide method which forms a silicide layer on each of a gate electrode and source/drain electrodes of a transistor. This method forms a refractory metal film such as a Ti film or the like overlying a gate electrode and a source/drain structure, and reacts the refractory metal film with the gate electrode and the source/drain electrodes by a heat treatment to form a silicide layer.

On the other hand, a buried gate transistor has been proposed for reducing a difference of level or height in a semiconductor device to achieve further miniaturization and integration. Specifically, the buried gate transistor is fabricated by forming a strip-like groove in a semiconductor substrate, and filling a conductive material into this groove to form a gate electrode.

In the buried gate transistor having a salicide structure as mentioned above, if source/drain electrodes are formed with a small junction depth, for example, as is the case of an LDD structure, silicide layers are formed to intrude into the semiconductor substrate so that the silicide layers extend deeper than the junction depth of the source/drain electrodes, thus causing a fear of short-circuiting with the semiconductor substrate.

JP-A-2-46775 discloses a semiconductor device which has a silicide layer formed on a portion of the surface of a buried gate electrode as a contact with an upper electrode.

Although, according to JP-A-2-46775, the disclosed technique does eliminate the problem of the silicide layer formed deeper than the junction depth of the source/drain electrodes, another problem arises as follows. In a buried gate transistor, an insulating film for isolating a gate electrode from a semiconductor substrate is formed by thermal oxidization on the inner wall of a groove together with a gate insulating film. Although this insulating film has substantially the same thickness as the gate insulating film, reliable separation of a silicide layer on the gate electrode from a silicide layer on source/drain electrodes is difficult for the insulating film of such a thickness to achieve. In this case, therefore, the resultant transistor will inevitably suffer from significant degradation in characteristics.

JP-A-7-30104 in turn discloses a semiconductor device which has a side-wall insulating film formed inside of a groove for forming a gate electrode therein so as to physically and electrically separate a silicide layer on the gate electrode and silicide layers on source/drain electrodes by this side-wall insulating film in a silicide forming step.

This side-wall insulating film, however, does not cover a side wall of the gate electrode, so that the gate electrode is located in a close proximity to the source/drain electrodes only with an intervening gate insulating film, thus incurring a danger of leading to possible short-circuiting therebetween and an increase in parasitic capacitance.

Further, JP-A-8-32063 discloses a semiconductor device which has a silicon oxide film formed on the bottom surface of a groove for forming a gate electrode therein, and a titanium film deposited thereon, with the silicon oxide film and the titanium film being thermally treated to form a titanium silicide film on the interface therebetween.

In this semiconductor device, however, no silicide films are formed on source/drain electrodes. Neither is there formed a side-wall insulating film for covering the side wall of the gate electrode.

SUMMARY OF THE INVENTION

It is therefore an object of the present invention to provide a highly reliable semiconductor device and a manufacturing method thereof for ensuring high speed operations while maintaining high performance by applying a salicide structure to a buried gate transistor to largely reduce a difference of level or height in the device and to reduce the resistance of a gate electrode and source/drain electrodes.

To achieve the above object, a semiconductor device according to the present invention comprises a semiconductor substrate formed with a groove, a gate electrode formed over a bottom surface of the groove in the semiconductor substrate through a gate insulating film, a pair of impurity diffusion layers formed on both sides of the gate electrode in a region of the semiconductor substrate, a first silicide layer formed on the gate electrode, a second silicide layers formed on the pair of impurity diffusion layers, and side-wall insulating films formed in the groove of the semiconductor substrate to cover the gate electrode and both side surfaces of the first silicide layer, wherein each of the side-wall insulating films has a thickness larger than that of the gate insulating film.

Also, a method of manufacturing a semiconductor device in accordance with a first aspect of the present invention comprises the steps of forming a first insulating film over a semiconductor substrate, forming a groove through the first insulating film and in the semiconductor substrate, forming a second insulating film on the semiconductor substrate including an interior of the groove, processing the second insulating film to form side-wall insulating films covering only side-wall surfaces of the groove, forming a third insulating film on the semiconductor substrate exposed on a bottom surface of the groove, forming a silicon film on the semiconductor substrate including the inside of the groove, removing a superficial layer of the silicon film until the first insulating film is exposed, implanting an impurity into the silicon film and the semiconductor substrate, diffusing the impurity to form a pair of impurity diffusion layers on both sides of the silicon film in the semiconductor substrate, removing a superficial layer of the silicon film in the groove with the first insulating film used as a mask, removing the first insulating film, forming a refractory metal film on the semiconductor substrate including the silicon film and the pair of impurity diffusion layers, reacting the silicon film with the refractory metal film and reacting the pair of impurity diffusion layers with the refractory metal film by thermal treatment to form a silicide layer on the silicon film and on each of the pair of impurity diffusion layers, and removing a non-reacted portion of the refractory metal film.

Further, a method of manufacturing a semiconductor device in accordance with a second aspect of the present invention comprises the steps of forming a groove in a semiconductor substrate, forming a first insulating film inside the groove, forming a silicon film on the semiconductor substrate including the inside of the groove, removing a superficial layer of the silicon film to fill the inside of the groove with the silicon film through the first insulating film, implanting an impurity into the silicon film and the semiconductor substrate to from a pair of impurity diffusion layers on both sides of the silicon film in the semiconductor substrate, thermally treating a surface of the semiconductor substrate to form side-wall insulating films between the silicon film and the pair of impurity diffusion layers, wherein each of the side-wall insulating films has a width gradually extending from a bottom to a superficial layer, forming a refractory metal layer on the semiconductor substrate including the silicon film and the pair of impurity diffusion layers, reacting the silicon film with the refractory metal film and reacting the pair of impurity diffusion layers with the refractory metal film by thermal treatment to form a silicide layer on the silicon film and on each of said pair of impurity diffusion layers, and removing a non-reacted portion of the refractory metal film.

In the semiconductor device of the present invention, the side-wall insulating films having a large thickness as compared with the thickness of the insulating film, later formed into a gate insulating film, are formed between the buried gate electrode and the pair of impurity diffusion layers, later formed into source/drain electrodes, so that sufficient insulation is readily ensured between the silicide layer on the gate electrode and the silicide layers on the respective impurity diffusion layers by the side-wall insulating films. Therefore, even when the salicide structure is applied to a buried gate transistor, a transistor having a low resistance value and a small level difference, sufficiently contributable to an increase in miniaturization and integration, is realized without giving rise to short-circuiting between the respective silicide layers.

DESCRIPTION OF THE PREFERRED EMBODIMENTS

In the following, several specific embodiments of a semiconductor device and a manufacturing method thereof according to the present invention will be described in detail with reference to the accompanying drawings.

First Embodiment

Figure 1A:
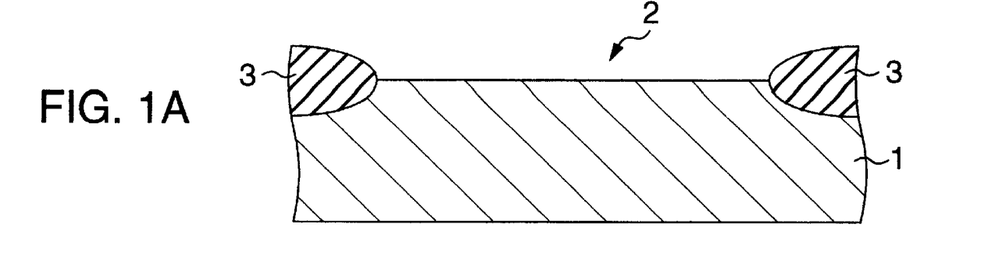
FIGS. 1A to 1N are cross-sectional views illustrating in order various steps in a method of manufacturing a semiconductor device according to a first embodiment of the present invention.

A first embodiment will now be described. The first embodiment illustrates a so-called buried gate MOS transistor, as a semiconductor device, which will be described with respect to the structure together with a manufacturing method thereof. FIGS. 1A–1N are schematic cross-sectional views illustrating in order of occurring various steps of a method of manufacturing a DRAM according to the first embodiment.

First, as illustrated in FIG. 1A, a field oxide film 3 is formed, for example, on a p-type silicon semiconductor substrate 1 as an element separation structure by a so-called LOCOS method to define an element forming region 2. It should be noted that instead of the field oxide film 3, a field shield element separation structure may be formed by a field shield element separation method. Specifically, in the field shield element separation structure, a conductive film is buried in an insulating film, and a site of a silicon semiconductor substrate immediately below the conductive film is clamped at a predetermined potential by the conductive film to provide the element separation. Further alternatively, a trench type element separation structure may be formed, wherein the silicon semiconductor substrate 1 is formed with a groove which is filled up with an insulating film.

Figure 1B:
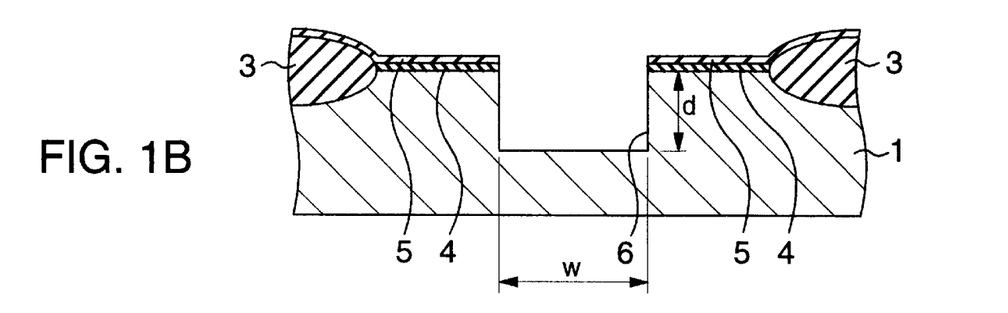

Next, as illustrated in FIG. 1B, the top surface of the element forming region 2, defined by the field oxide film 3, is thermally oxidized to form a pad thermal oxide film 4 having a thickness of approximately 20 nm. Subsequently, a silicon nitride film 5 is deposited on the pad thermal oxide film 4 by a CVD method or the like to a thickness of approximately 30 nm. It should be noted that the formation of the pad thermal oxide film 4 may be omitted to form the silicon nitride film 5 directly on the silicon semiconductor substrate 1. Then, after forming a resist film, not shown, overlying the silicon nitride film 5, the pad thermal oxide film 4 and the silicon semiconductor substrate 1 by photolithography, the silicon nitride film 5, the pad thermal oxide film 4 and the silicon semiconductor substrate 1 are patterned by reactive ion etching using first a mixture gas consisting of $CF_4$ and $H_2$ and next a $CF_4$ gas, to form a strip-like groove 6 having a width $\underline{w}$ equal to approximately 0.6 μm and a depth $\underline{d}$ equal to approximately 200 nm.

Figure 1C:
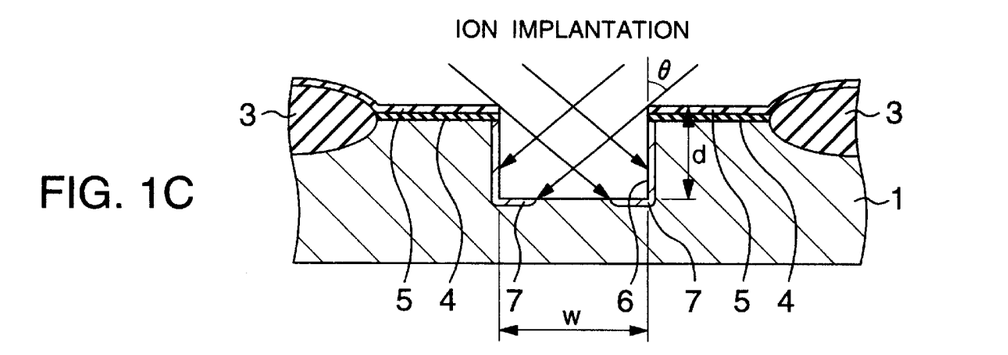

Next, as illustrated in FIG. 1C, an n-type impurity, for example, phosphor (P) ion, is implanted at an angle θ of 65° to a plane perpendicular to the silicon semiconductor substrate 1 to introduce the impurity into both side walls and a portion of the bottom surface of the groove 6, thus forming a shallow junction layer 7. In this event, it is necessary to implant ion only into regions near both ends or corners except for a central portion on the bottom surface of the groove 6. As an appropriate condition for carrying out this ion implantation, w>d·tan θ>w/2 is required, and more preferably, w>d·tan θ>2w/3 is required. With the latter condition, the bottom surface of the groove 6 is equally divided into three, i.e., a central portion and two end portions. As appropriate conditions for the ion implantation in this case, a dose is in a range of approximately $1 \times 10^{14}$ to $5 \times 10^{14}$ (/cm$^2$), and an acceleration energy is approximately 15 (keV). When an n-type silicon semiconductor substrate is used, a p-type impurity, for example, $BF_2$ ion may be introduced at the same dose and a predetermined acceleration energy equal to or lower than 65 (keV). It should be noted that the angle of the ion implantation is not definite but may be appropriately selected in accordance with the width of an opening in the element forming region 2 and the width of side-wall insulating films 9, later referred to.

Figure 1D:
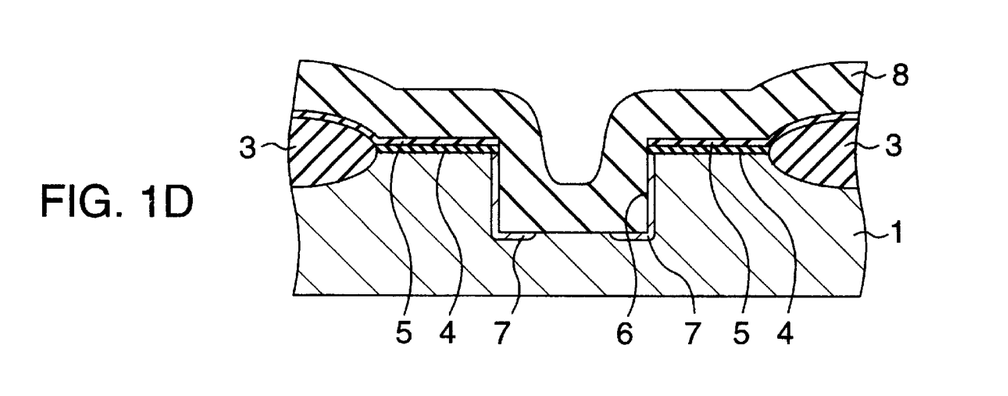

Next, as illustrated in FIG. 1D, a silicon oxide film 8 is deposited over the entire surface of semiconductor substrate 1 to cover the inner wall surface of the groove 6 by a CVD method or the like in a thickness of approximately 120 nm.

Figure 1E:
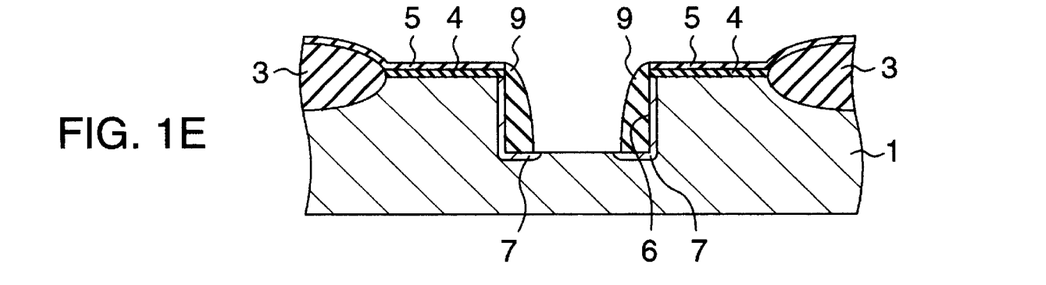

Subsequently, as illustrated in FIG. 1E, the entire surface of the silicon oxide film 8 is anisotropically etched, using a mixture gas consisting of $CF_4$ and $H_2$, with the silicon nitride film 5 used as a stopper, to leave only portions of the silicon oxide film 8 covering the side walls of the groove 6, thus forming the side-wall insulating films 9. The side wall insulating films 9 are each formed with a thickness ranging from 0.1 μm to 0.2 μm, and approximately 0.15 μm in this embodiment. In this event, the silicon nitride film 5 serving as a mask protects the silicon semiconductor substrate 1 from being etched by the mixture gas, so that the surface is prevented from being damaged.

Figure 1F:
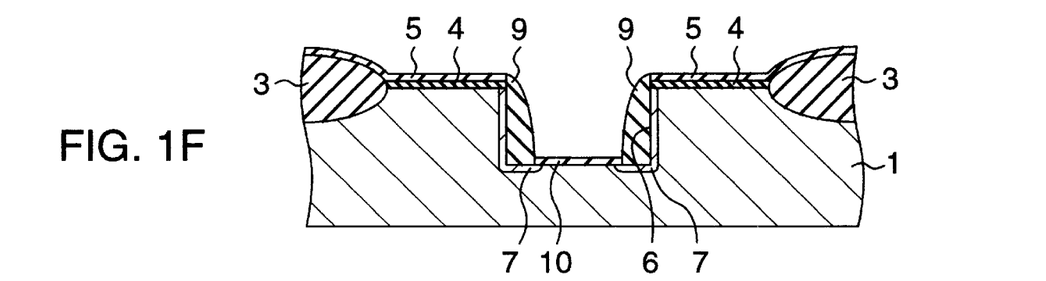

Next, as illustrated in FIG. 1F, the bottom surface of the groove 6, which is the surface of the exposed silicon semiconductor substrate, is thermally oxidized to form a gate insulating film 10 in a thickness of approximately 10 nm.

Figure 1G:
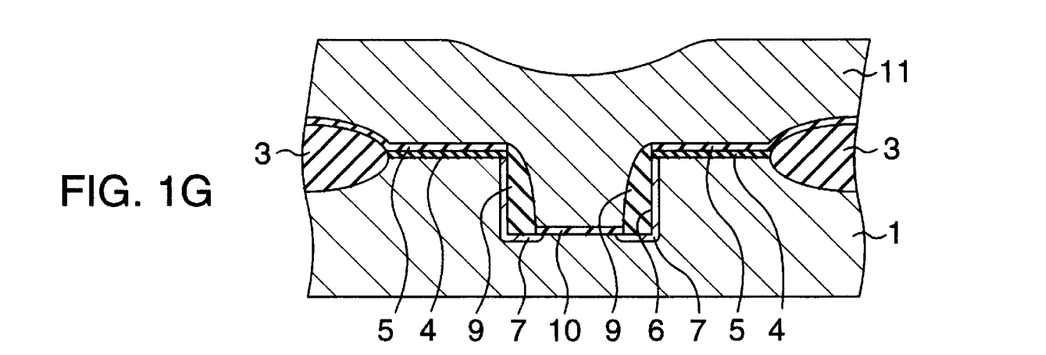

Next, as illustrated in FIG. 1G, a polycrystalline silicon film 11 is deposited over the entire surface including the groove 6 by a CVD method.

Figure 1H:
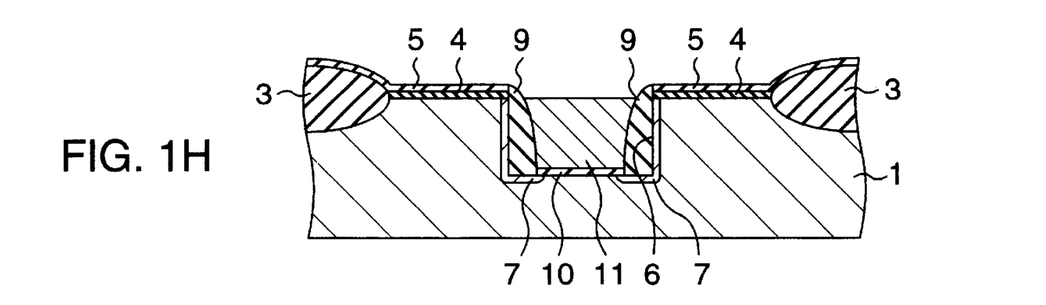

Subsequently, as illustrated in FIG. 1H, the polycrystalline silicon film 11 is polished by a chemical mechanical polishing method (CMP method), again with the silicon nitride film 5 used as a stopper, to remove its superficial layer. In this event, the polycrystalline silicon film 11 remains only in the groove 6 with its surface being planarized. Due to a difference in polishing speed between the silicon nitride film 5 and the polycrystalline silicon film 11, the planarized surface of the polycrystalline silicon film 11 is lower by approximately 30 nm than the surface of the silicon nitride film 5. Instead of the CMP method, the polycrystalline silicon film 11 may be etched by reactive ion etching.

Figure 1I:
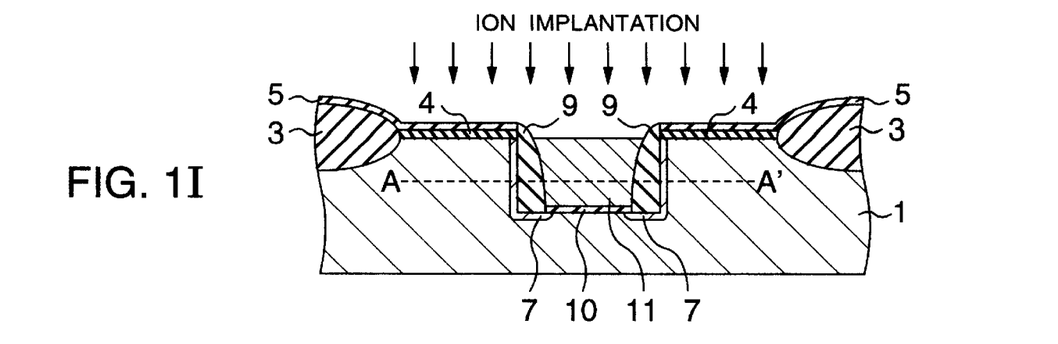

Next, as illustrated in FIG. 1I, an n-type impurity, arsenic (As) ion in this case, is implanted over the entire surface. Specifically, the ion implantation is performed at a dose of approximately $5 \times 10^{15}$ (/cm$^2$) and an acceleration energy of approximately 160 (keV). The impurity introduced at this time passes through the silicon nitride film 5 and the pad thermal oxide film 4 to reach the silicon semiconductor substrate 1 at a predetermined depth indicated by a broken line A–A' in FIG. 1I. This depth may be a predetermined value smaller than the thickness of the polycrystalline silicon film 11 in the groove 6. When an n-type silicon semiconductor substrate is used, a p-type impurity, for example, BF$_2$ ion may be introduced at the same dose and an acceleration energy of approximately 30 (keV).

Figure 1J:
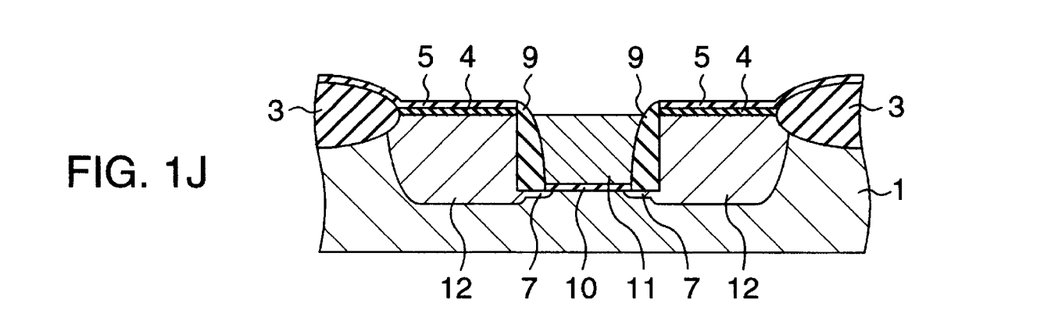
Figure 1K:
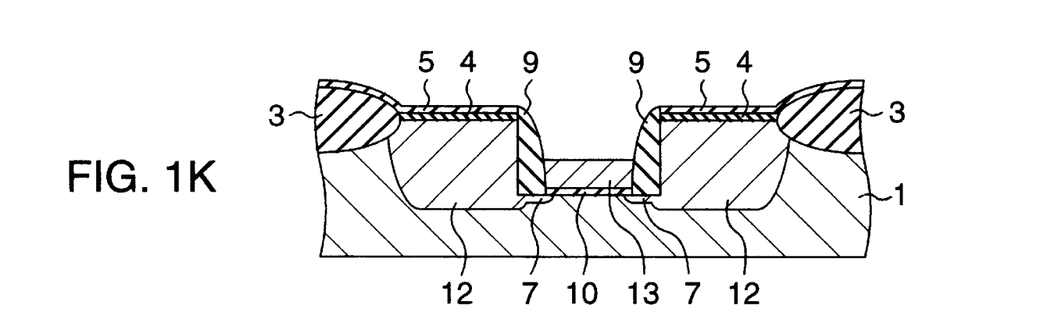

Next, as illustrated in FIG. 1J, the silicon semiconductor substrate 1 is annealed at a temperature of 1000° C. for one hour to diffuse the introduced impurity in the silicon semiconductor substrate 1, thus forming a pair of impurity diffusion layers 12 joined with a shallow junction layer 7. These impurity diffusion layers 12 are integrated with the junction layer 7 to form a so-called LDD (lightly doped drain) structure, where the impurity diffusion layers 12 are formed to cover the side surfaces and bottom surfaces of the side-wall insulating films 9 with the junction layer 7 having one end overlapping with one end of the gate insulating film 10. Next, as illustrated in FIG. 1K, the polycrystalline silicon film 11 is etched by reactive ion etching, again with the silicon nitride film 5 used as a stopper, to remove a superficial layer of this polycrystalline silicon film 11 by approximately 50 nm to form a gate electrode 13.

Figure 1L:
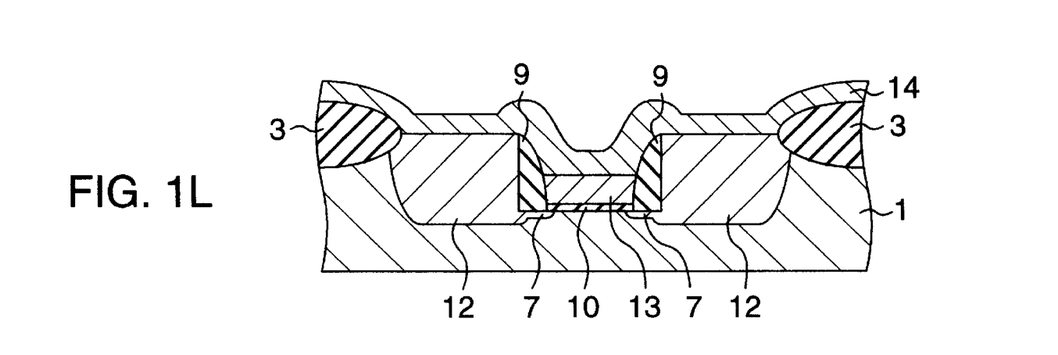

Next, as illustrated in FIG. 1L, the silicon nitride film 5 is removed by wet etching using a hot phosphoric acid, and thereafter the pad thermal oxide film 4 is removed by wet etching using a hydrofluoric acid. Subsequently, a refractory metal film, a Ti film 14 in this case, is deposited by a sputtering method or the like over the entire surface including the gate electrode 13 and the respective impurity diffusion layers 12 to a thickness of approximately 60 nm. The refractory metal film deposited herein may be formed of a Co film, a Pt film, a Ni film, a Mo film or the like, instead of the Ti film 14.

Figure 1M:
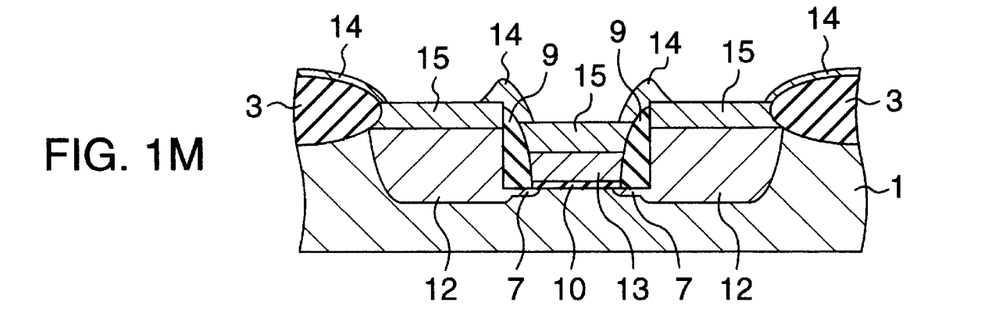
Figure 1N:
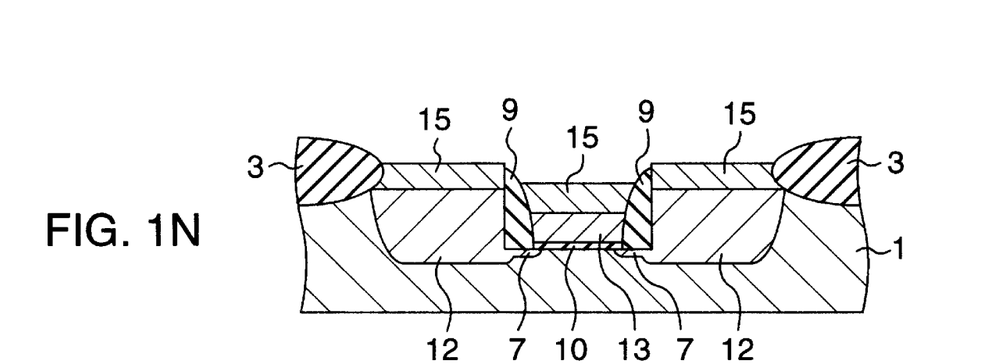

Next, as illustrated in FIG. 1M, the silicon semiconductor substrate 1 is subjected to rapid anneal treatment to react the Ti film 14 with the gate electrode 13 and the Ti film 14 with the respective impurity diffusion layers 12 to form a silicide layer 15 made of TiSi$_2$ on each of the gate electrode 13 and the respective impurity diffusion layers 12, thus completing a salicide structure. In this event, the rapid anneal treatment is performed at temperatures ranging from approximately 650° C. to 900° C. for a thermal treatment time ranging from several seconds to approximately 30 seconds, and at 850° C. for 10 seconds in this case. Since the side-wall insulating films 9 are formed to have a relatively large thickness, a tolerance of the silicide layers 15 in thickness is made less strict, so that the silicide layers 15 may be made thicker, by way of example.

Next, as illustrated in FIG. 1N, a non-reacted Ti film 14 is removed using a mixture liquid consisting of NH$_4$Cl and H$_2$O$_2$. In this event, the respective silicide layers 15 have their top surfaces positioned lower than the top surfaces of the side-wall insulating films 9, thereby ensuring that the respective silicide layers 15 are sufficiently insulated by the side-wall insulating films 9.

Subsequently, though the illustration is omitted, after several steps including the formation of another inter-layer insulating film, formation of contact holes, subsequent formation of wiring layers, and so on, a buried gate MOS transistor is completed.

It should be noted that while in the first embodiment, the ion implantation for forming the impurity diffusion layers 12 is performed before the formation of the salicide structure, the ion implantation may be performed after the formation of the salicide structure. In addition, if no LDD structure is required, the shallow junction layer 7 need not be formed.

As described above, in the first embodiment, the side-wall insulating films 9, having a large thickness as compared with the thickness of the gate insulating film 10, are formed between the buried gate electrode 13 and the pair of impurity diffusion layers 12, later formed into source/drain electrodes, so that sufficient insulation is readily ensured between the silicide layer 15 on the gate electrode 13 and the silicide layers 15 on the respective impurity diffusion layers 12 by the side-wall insulating films 9. Therefore, even when the salicide structure is applied to a buried gate MOS transistor, a MOS transistor having a low resistance value and a small level difference, sufficiently contributable to an increase in miniaturization and integration is realized without giving rise to short-circuiting between the respective silicide layers 15.

It is therefore possible, according to the first embodiment, to largely reduce a difference of level or height in a MOS transistor as well as to reduce the resistance of the gate electrode 13 and the respective impurity diffusion layers 12 to realize a highly reliable MOS transistor capable of high speed operations while maintaining high performance.

Second Embodiment

Next, a second embodiment of the present invention will be described. While the second embodiment also illustrates a buried gate MOS transistor as a semiconductor device, similarly to the first embodiment, the second embodiment differs in the shape of the side-wall insulating films and a manufacturing method thereof. FIGS. 2A to 2L are schematic cross-sectional views illustrating various steps in a method of manufacturing the MOS transistor according to the second embodiment. Again in the second embodiment, the structure of the MOS transistor is described along with the manufacturing method. Also, the same components and so on as those in the first embodiment are designated with the same reference numerals, and description thereof is omitted.

Figure 2A:
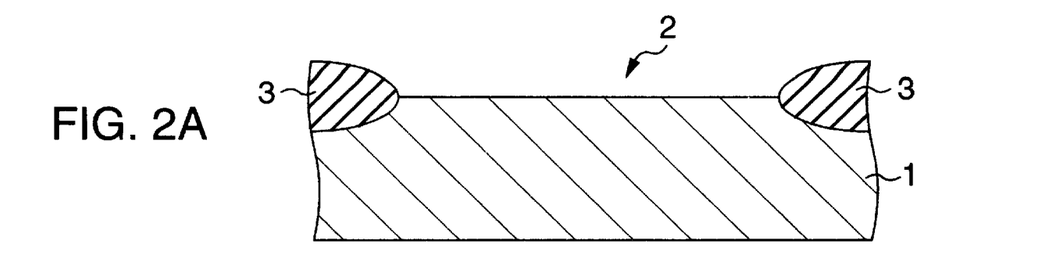
FIGS. 2A to 2L are cross-sectional views illustrating in order various steps in a method of manufacturing a semiconductor device according to a second embodiment of the present invention.

First, as illustrated in FIG. 2A, a field oxide film 3 is formed, for example, on a p-type silicon semiconductor substrate 1 as an element separation structure by a so-called LOCOS method to define an element forming region 2. It should be noted that instead of the field oxide film 3, a field shield element separation structure may be formed by a field shield element separation method. Specifically, in the field shield element separation structure, a conductive film is buried in an insulating film, and a site of a silicon semiconductor substrate immediately below the conductive film is clamped at a predetermined potential to provide element separation. Further alternatively, a trench type element separation structure may be formed, wherein the silicon semiconductor substrate 1 is formed with a groove which is filled up with an insulating film.

Figure 2B:
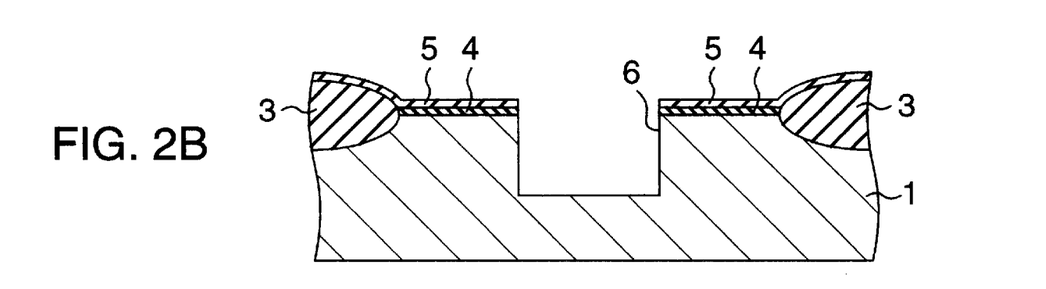
Figure 2C:
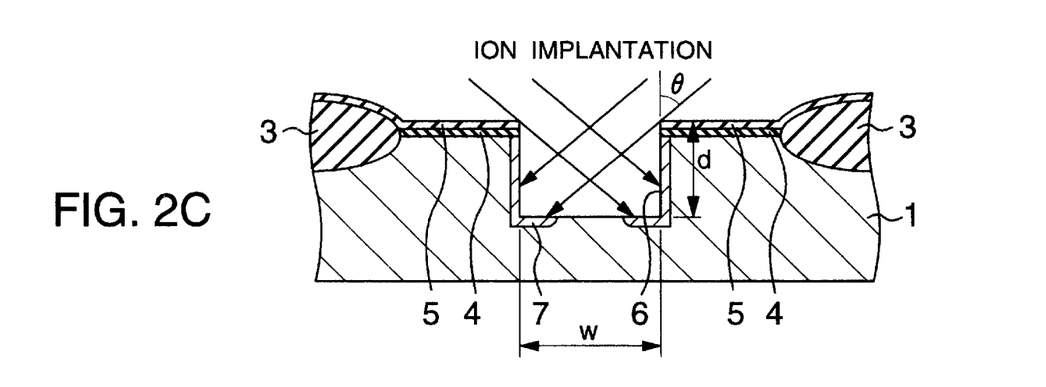

Next, as illustrated in FIG. 2B, the top surface of the element forming region 2, defined by the field oxide film 3, is thermally oxidized to form a pad thermal oxide film 4 having a thickness of approximately 20 nm. Subsequently, a silicon nitride film 5 is deposited on the pad thermal oxide film 4 by a CVD method or the like to a thickness of approximately 30 nm. Then, after forming a resist film, not shown, overlying the silicon nitride film 5, the pad thermal oxide film 4 and the silicon semiconductor substrate 1 by photolithography, the silicon nitride film 5, the pad thermal oxide film 4 and the silicon semiconductor substrate 1 are patterned by reactive ion etching using first a mixture gas consisting of $CF_4$ and $H_2$ and next a $CF_4$ gas, to form a strip-like groove 6 having a width equal to approximately 0.6 μm and a depth equal to approximately 200 nm. If an LDD structure is formed, a shallow junction layer 7 is formed by implanting ion obliquely to the substrate 1, as is the case of the first embodiment (FIG. 2C). Conditions for the ion implantation are identical to those in the first embodiment.

Figure 2D:
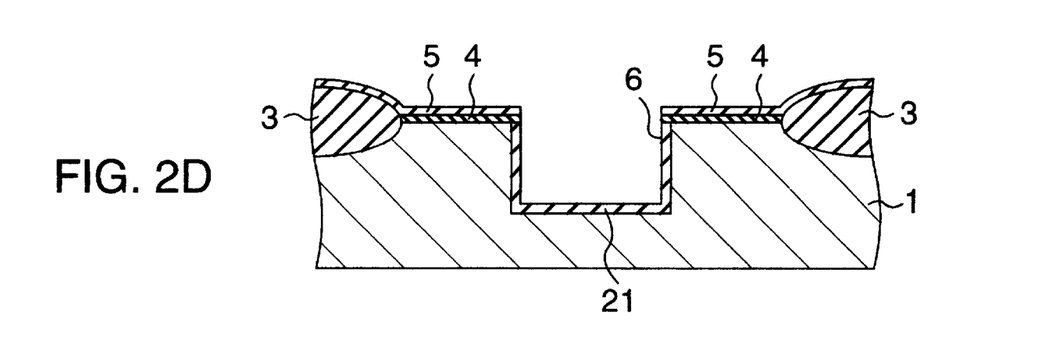

Next, as illustrated in FIG. 2D, the inner wall surface of the groove 6, which is the surface of the exposed silicon semiconductor substrate 1, is thermally oxidized to form a gate insulating film 21 having a thickness ranging from approximately 9 nm to 20 nm. FIGS. 2C to 2K illustrate manufacturing steps when an LDD structure is not formed.

Figure 2E:
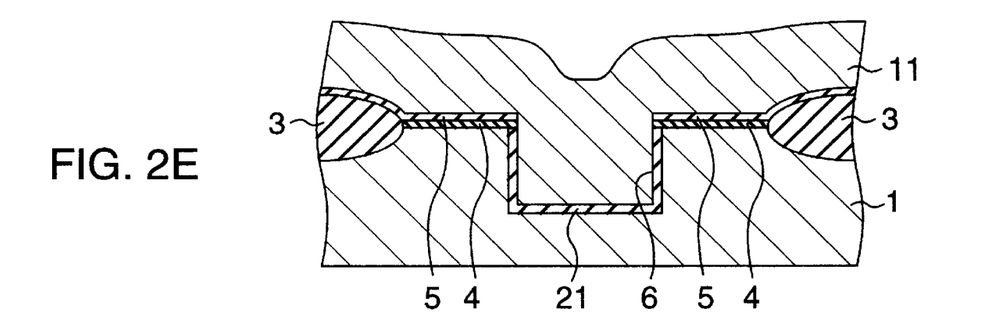

Next, as illustrated in FIG. 2E, a polycrystalline silicon film 11 is formed over the entire surface including the groove 6 by a CVD method.

Figure 2F:
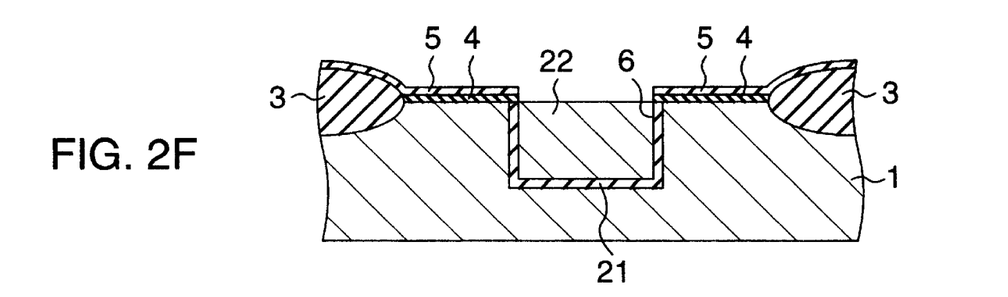

Subsequently, as illustrated in FIG. 2F, the polycrystalline silicon film 11 is polished by a chemical mechanical polishing method (CMP method), with the silicon nitride film 5 used as a stopper, to remove its superficial layer. In this event, the polycrystalline silicon film 11 remains only in the groove 6 with its surface being planarized to form a gate electrode 22. Instead of the CMP method, the polycrystalline silicon film 11 may be etched by reactive ion etching. Also, the CMP method and wet etching may be used together.

Figure 2G:
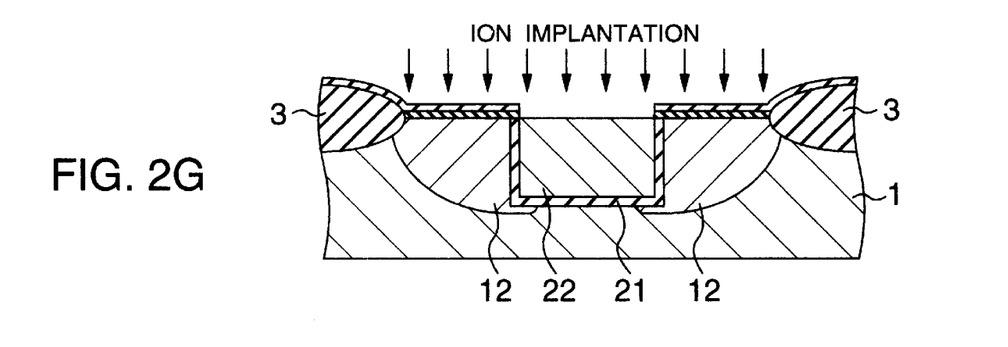

Next, as illustrated in FIG. 2G, an n-type impurity, phosphor (P) ion in this case, is implanted over the entire surface. Specifically, the ion implantation is performed at a dose of approximately $3 \times 10^{15}$ (/cm$^2$) and an acceleration energy of approximately 100 (keV). The impurity introduced at this time passes through the silicon nitride film 5 and the pad thermal oxide film 4 to reach the silicon semiconductor substrate 1 at a predetermined depth. This depth may be a predetermined value smaller than the thickness of the gate electrode 22 in the groove 6. Subsequently, the silicon semiconductor substrate 1 is annealed at a temperature of 1000° C. for 30 minutes to diffuse the introduced impurity in the silicon semiconductor substrate 1, thus forming a pair of impurity diffusion layers 12 on both sides of the gate electrode 22 through the gate insulating film 21.

Figure 2H:
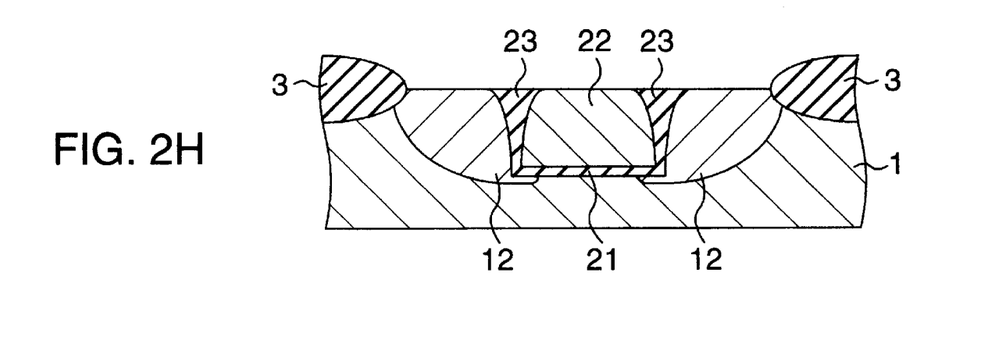

Next, as illustrated in FIG. 2H, the entire surface is isotropically etched to remove the silicon nitride film 5 and the pad thermal oxide film 4 to expose the surface of the silicon semiconductor substrate 1. Then, the silicon semiconductor substrate 1 is thermally treated at a temperature of approximately 900° C. in an oxygen atmosphere for several minutes to several tens of minutes. In this event, a side-wall insulating film 23 made of a so-called bird-beak like silicon oxide film in the LOCOS method is formed near the boundary of the groove 6 and each impurity diffusion layer 12, i.e., centered about the gate insulating film 21. Each of the side-wall insulating film 23 is formed in such a shape that has a width gradually reduced from the top to the bottom. In other words, the side-wall insulating film 23 substantially has a wedge shape with the top surface having the largest width (thickness). Specifically, the top surface has a width in a range of approximately 0.1 μm to 0.2 μm. Since the gate insulating film 21 free from the influence of the thermal oxidization remains in the bottom portion of the side-wall insulating film 23, this portion (thickness) has a width in a range of approximately 9 nm to 20 nm.

Figure 2I:
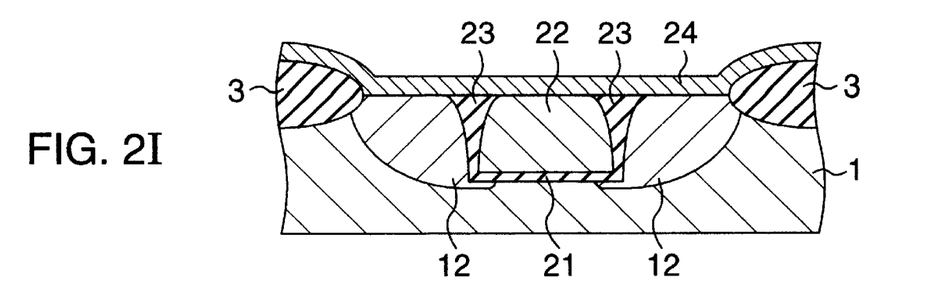

Next, after removing a thermally oxidized film, not shown, formed on the surface of the impurity diffusion layers 12 by wet etching using fluoride, a refractory metal film, a Ti film 24 in this case, is deposited by a sputtering method or the like over the entire surface including the gate electrode 22 and the respective impurity diffusion layers 12 in a thickness of approximately 60 nm, as illustrated in FIG. 2I. The refractory metal film deposited herein may be formed of a Co film, a Pt film, a Ni film, a Mo film or the like, instead of the Ti film 24.

Figure 2J:
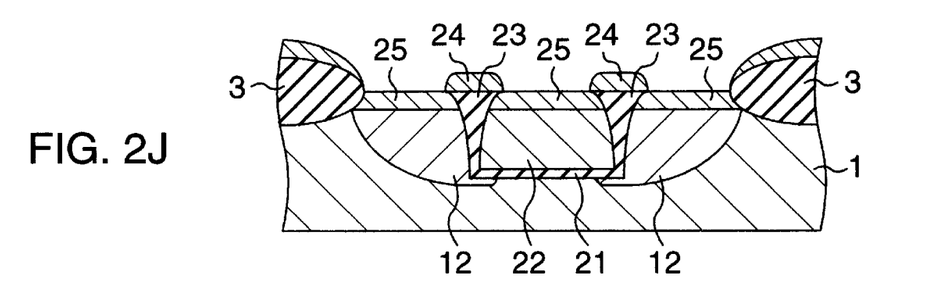

Next, as illustrated in FIG. 2J, the silicon semiconductor substrate 1 is subjected to rapid anneal treatment to react the Ti film 24 with the gate electrode 22 and the Ti film 24 with the respective impurity diffusion layer 12 to form a silicide layer 25 made of $TiSi_2$ on each of the gate electrode 22 and the respective impurity diffusion layers 12, thus completing a salicide structure. In this event, the rapid anneal treatment is performed specifically at temperatures ranging from approximately 650° C. to 900° C. for a thermal treatment time ranging from several seconds to approximately 30 seconds, and at 850° C. for 10 seconds in this case. Since the side-wall insulating films 23 are formed in a relatively large thickness, a tolerance of the silicide layers 25 in thickness is made less strict, so that the silicide layers 25 may be made thicker, by way of example.

Figure 2K:
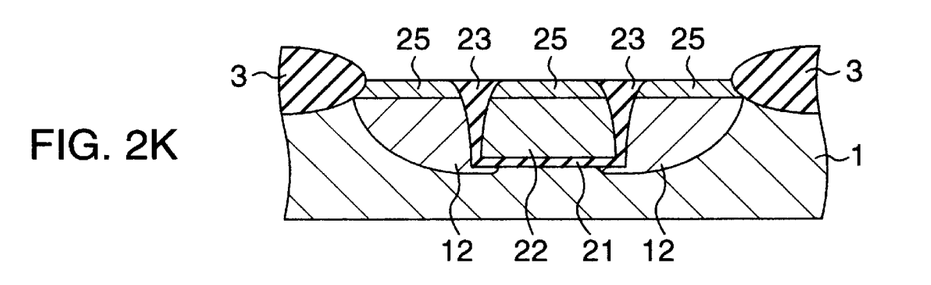
Figure 2L:
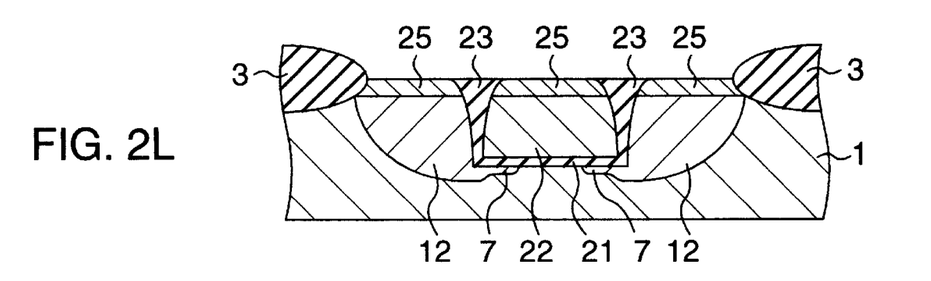

Next, as illustrated in FIG. 2K, a non-reacted Ti film 24 is removed using a mixture liquid consisting of $NH_4Cl$ and $H_2O_2$. In this event, the respective silicide layers 25 are separated by the side-wall insulating films 23, thereby ensuring that the respective silicide layers 25 are sufficiently insulated by the side-wall insulating films 23. In an LDD structure, the impurity diffusion layers 12 are integrated with the shallow junction layer 7, as illustrated in FIG. 2L.

Subsequently, though the illustration is omitted, after several steps including the formation of another inter-layer insulating film, formation of contact holes, subsequent formation of wiring layers, and so on, a buried gate MOS transistor is completed.

It should be noted that while in the second embodiment, the ion implantation for forming the impurity diffusion layers 12 is performed before the formation of the salicide structure, the ion implantation may be performed after the formation of the salicide structure.

As described above, in the second embodiment, the side-wall insulating films 23, having an upper portion formed with a large thickness as compared with the thickness of the gate insulating film 21, are formed between the buried gate electrode 22 and the pair of impurity diffusion layers 12, later formed into source/drain electrodes, so that sufficient insulation is readily ensured between the silicide layer 25 on the gate electrode 22 and the silicide layers 25 on the respective impurity diffusion layers 12 by the side-wall insulating films 23. Therefore, even when the salicide structure is applied to a buried gate MOS transistor, a MOS transistor having a low resistance value and a small level difference sufficiently contributable to an increase in miniaturization and integration is realized without giving rise to short-circuiting between the respective silicide layers 25.

It is therefore possible, according to the second embodiment, to largely reduce a difference of level or height in a MOS transistor as well as to reduce the resistance of the gate electrode 22 and the respective impurity diffusion layers 12 to realize a highly reliable MOS transistor capable of high speed operations while maintaining high performance.

According to the present invention, a salicide structure is applied to a buried gate transistor to largely reduce a difference of level or height in an element as well as to reduce the resistance of a gate electrode and source/drain electrodes to realize a highly semiconductor device capable of reliable high speed operations while maintaining high performance.

We claim:

1. A semiconductor device comprising:
   a semiconductor substrate formed with a groove;
   a gate electrode formed over a bottom surface of the groove in said semiconductor substrate with a gate insulating film between said gate electrode and said semiconductor substrate;
   a pair of impurity diffusion layers formed on both sides of said gate electrode in a region of said semiconductor substrate;
   a first silicide layer formed on said gate electrode;
   second silicide layers formed on said pair of impurity diffusion layers; and
   side-wall insulating films formed in the groove of said semiconductor substrate to cover side walls of said gate electrode and both side surfaces of said first silicide layer, each of said side-wall insulating films having a thickness larger than that of said gate insulating film, said thickness gradually increasing from a bottom to a top of said side-wall insulating film.

2. A semiconductor device according to claim 1, wherein:
   said side-wall insulating films are formed on the bottom surface of the groove in said semiconductor substrate.

3. A semiconductor device according to claim 1, wherein:
   said pair of impurity diffusion layers are formed to cover lower portions of said side-wall insulating films and to have end portions extending below said gate insulating film.

4. A semiconductor device according to claim 3, wherein:
   each of said pair of impurity diffusion layers includes a shallow junction layer having an end portion formed to extend below said gate insulating film.

5. A semiconductor device according to claim 1, wherein:
   said gate electrode includes polysilicon.

6. A semiconductor device according to claim 1, wherein:
   said first and second silicide layers include a compound of silicon and one of titanium, cobalt, platinum, nickel and molybdenum.

* * * * *